Aug. 29, 1961 D. I. POMERANTZ 2,998,534

SYMMETRICAL JUNCTION TRANSISTOR DEVICE AND CIRCUIT

Filed Sept. 4, 1958

INVENTOR.
DANIEL I. POMERANTZ
BY
ATTORNEY

United States Patent Office 2,998,534

Patented Aug. 29, 1961

2,998,534

SYMMETRICAL JUNCTION TRANSISTOR DEVICE AND CIRCUIT

Daniel I. Pomerantz, Lexington, Mass., assignor to Clevite Corporation, Cleveland, Ohio, a corporation of Ohio Filed Sept. 4, 1958, Ser. No. 759,078
11 Claims. (Cl. 307—88.5)

This invention relates to semiconductor devices and, more particularly, to junction transistors.

As is well known in the art a transistor, in its general form, may consist of a wafer of semiconductive material such as germanium or silicon containing selected impurities which determine its conductivity type, i.e., P-type or N-type. On one face of the wafer is an emitter region and on the opposite face a collector region, both regions being of a conductivity-type opposite to that of the wafer and forming therewith respective rectifying P-N junctions.

An ohmic connection to the wafer, known as the base, is provided. In operation the emitter and collector regions are biased with opposite polarity relative to the base. In order to obtain efficient, high-gain operation, the emitter junction customarily has an area smaller than and overlapped by that of the collector junction. This arrangement enables the collector junction to collect the fringe currents of the emitter junction.

From the foregoing description it will be seen that conventional transistors, inherently, are asymmetrical, i.e., they are suited for satisfactory operation in one direction only because the emitter and collector junctions are specifically proportioned and arranged for their respective functions and for predetermined bias polarities.

Some transistors have been made which are symmetrical; these have emitter and collector junctions of the same area with the result that they are characterized by a relatively low current-gain in either direction.

It is a fundamental object of the present invention to provide improved symmetrical transistors which avoid or overcome at least one of the disadvantages of prior art devices.

More specifically, it is an object of the present invention to provide novel symmetrical transistors characterized by high gain in both directions.

Another object is the provision of novel transistors which are completely symmetrical in structure and operation and wherein the effective ratio of emitter/collector area is variable in accordance with the polarity of the applied bias.

These and further objects are accomplished by novel semiconductor devices in accordance with the present invention which comprise a body of semiconductive material having at least two P-N junctions on each of a pair of opposite major surfaces, each junction on one surface being opposed by one on the opposite surface. An individual terminal connection is provided for one of the junctions and for the opposing junction. Individual impedance means electrically interconnect the respective junctions on each of the major surfaces and a base electrode is provided making non-rectifying contact with the body.

Additional objects of the invention, its advantages, scope, and the manner in which it may be practiced will be apparent to those conversant with the art from the following description and subjoined claims taken in conjunction with the annexed drawing in which:

Figures 1, 2, 3, 4, 5:
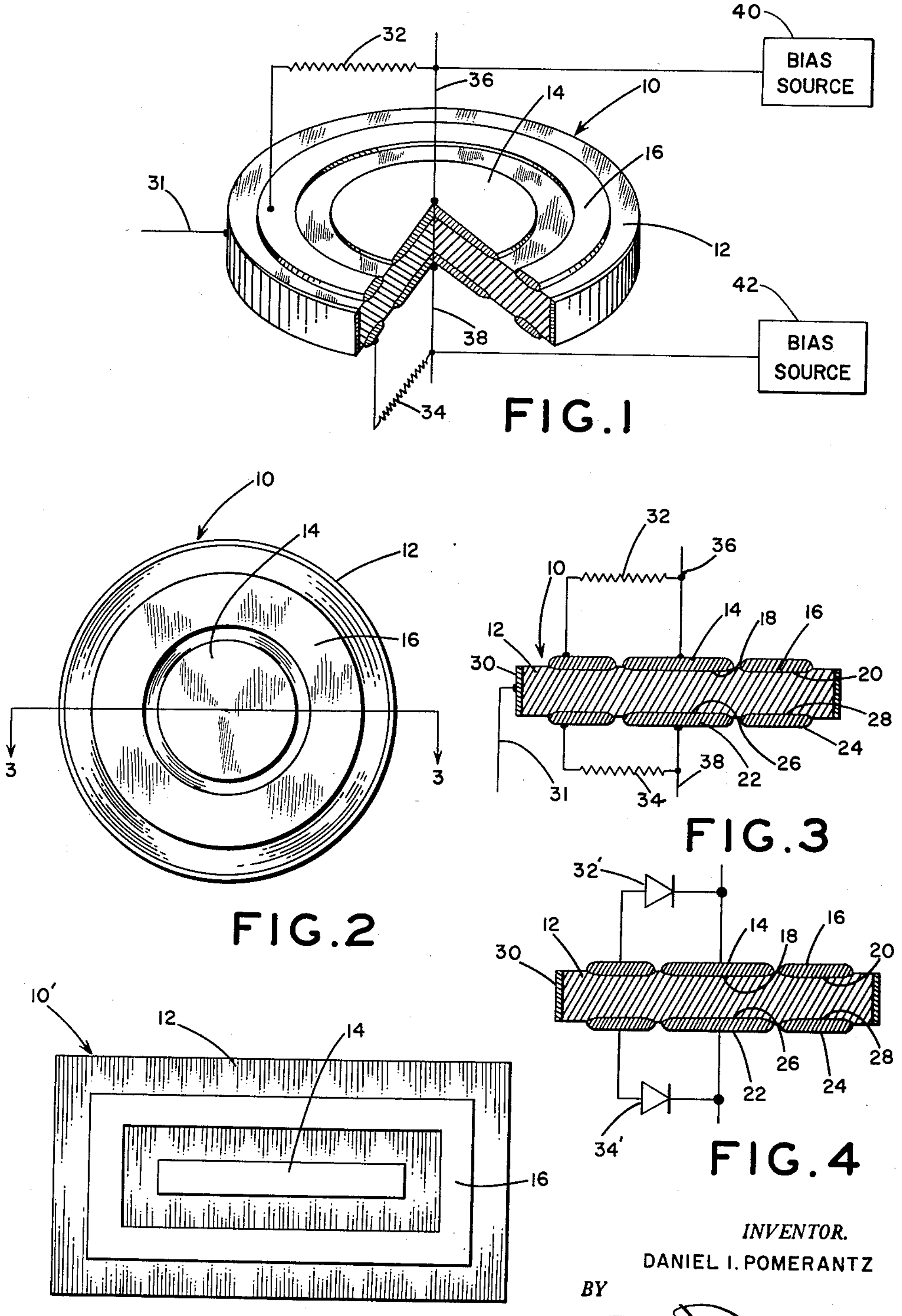
FIGURE 1 is a perspective elevational view, partly in section, illustrating a junction transistor in accordance with the present invention.
FIGURE 2 is a top plan view of the device shown in FIGURE 1.
FIGURE 3 is a diametral section taken on line 3—3 of FIGURE 2.
FIGURE 4 is a diametral section similar to FIGURE 3 showing a modified embodiment of the present invention.
FIGURE 5 is a top plan view of a modified form of transistor embodying the present invention.

Referring now to the drawings, FIGURE 1 illustrates a semiconductor device 10 in accordance with the present invention. In the figure, a circular sector of somewhat less than 90° has been broken away to expose parts which otherwise would be obscured. Device 10 consists of a body 12 of semiconductive material such as germanium or silicon, suitably doped with donor or acceptor impurities, to impart the desired type of conductivity, all in a manner well understood in the art.

Body 12, commonly referred to as a "wafer," is shown as being a thin disk but it will be understood that, while this configuration is convenient and preferred, others may be employed.

On one surface of wafer 12 are regions 14 and 16 of a conductivity-type opposite to that of wafer 10. For ease of description, wafer 10 hereinafter will be considered as N-type; accordingly regions 14 and 16 would be P-type. Regions 14 and 16, which may be formed by alloying, or any other suitable method, form with wafer 12, respective P-N junctions 18 and 20, best shown in FIGURE 3, one surrounding the other. In the illustrated embodiment junction 18 is generally circular and centrally located with respect to the wafer; junction 18 is annular and concentric with junction 16.

On the opposite surface of wafer 12 are regions 22 and 24, of conductivity-type opposite to that of wafer 12 and, therefore, in the exemplary embodiment, P-type. Regions 22 and 24 form respective P-N junctions 26 and 28 which, individually and collectively, are substantially identical in area and configuration to and are located opposite junctions 18 and 20 respectively.

A base electrode 30 making ohmic contact with wafer 12 is provided, taking the form of a rim on the peripheral edge of the wafer. A lead wire or terminal 31 provides for circuit connections to base electrode 30.

In the foregoing description, use of the terms "emitter" and "collector" has been avoided inasmuch as the device described is completely symmetrical in operation and the function of the various P-N junctions depends on the direction of bias as will appear presently.

As shown schematically in FIGURES 1 and 3, individual impedance means represented by resistors 32 and 34, are provided to electrically interconnect, respectively, regions 14 and 16 on one surface of wafer 12 and regions 22 and 24 on the opposite surface. Thus a resistor 32 has one end connected to annular P-type region 16 and its other end connected to a suitable lead or terminal wire 36 which enables the electrical connection of circular P-type region 14 directly to a source 40 of unidirectional bias potential of suitable magnitude and desired polarity. In like manner, resistor 34 is connected between annular P-type region 24 and a lead or terminal wire 38 which enables the electrical connection of circular P-type region 22 to a source 42 of unidirectional bias potential of suitable magnitude and opposite polarity with respect to source 40.

Resistors 32 and 34 have substantially equal values of ohmic resistance and, individually, comparable to the forward resistance of junction 18 or 26. In a commerical device, resistors 32 and 34, preferably, would be encapsulated or otherwise encased with wafer 12 to form a unitary structure having leads 31, 36 and 38 only protruding for circuit connections. It will be appreciated, however, that resistors 32 and 34 may be provided externally of the encased device and/or may take any suitable form. Thus, for example, resistors 32 and 34 may take the form of respective layers or coatings of resistive material applied to the surfaces of wafer 12 between regions 14 and 16 and between 22 and 24. Each such layer could be a complete annulus or could consist of one or more segments connecting the respective regions 14 and 16 or 22 and 24 at several points.

In operation, terminals 36 and 38 are connected individually to respective sources 40 and 42 of bias potential rendering one negative and the other positive with respect to base 30. Assuming source 40 is positive, P-N junctions 18 and 20 are forwardly biased and can be regarded as emitters. Under these conditions, both 18 and 20 emit holes but, because of the resistive impedance provided by 32, emitter junction 20 emits much less current per unit area than emitter junction 18. Junctions 26 and 28 are sufficiently reverse biased that both are collecting with high efficiency.

Th effective emitter area under the assumed bias conditions, therefore, is substantially equal to the area of P-N junction 18 whereas the collector area is the sum of the areas of P-N junctions 22 and 24. Thus, the device is operating, in effect, with a small emitter junction opposed by a larger collector junction which peripherally overlaps the emitter junction, resulting in high current gain. Inasmuch as the device is mechanically symmetrical, the same results in the opposite direction are obtained if terminal 36 is biased negative and 38 is biased positive with respect to base 30.

From the foregoing description it will be understood that the relative areas of and spacing between the P-N junctions are important factors and may be determined by analogy to conventional (i.e., single emitter and single collector) transistors. In the most usual case, for example, the area of the annular junctions 20, 28 would be comparable to the difference between emitter and collector areas in a conventional transistor and the spacing between the circular and annular junctions would be kept to a practical operative minimum.

In the foregoing description, the impedance means 32 and 34 have been illustrated and described as simple resistors. It is pointed out that this is merely for the sake of example and literary expediency; resistors 32 and 34 are intended to represent generically any type of resistive impedance operative for the purposes of the invention. While a variety of resistive impedances may be employed, non-linear or asymmetrical resistance means such as diodes are preferred. A preferred embodiment of the invention, utilizing semiconductor junction diodes, is illustrated in FIGURE 4 wherein the elements of the transistor proper are identical to and designated by the same reference numerals as those in FIGURES 1 to 3. The resistive impedance means comprises a pair of junction diodes, 32′ and 34′, connected back-to-back with respect to the annular junctions 20, 24.

The operation of this embodiment is the same as that already described. Depending on the polarities applied to terminals 36 and 38, one diode would be biased forwardly, thus having low resistance, and the other would be reverse-biased to its high resistance condition.

It will be appreciated that, while discoid and annular configurations are particularly well suited to semiconductor devices according to the invention for practical as well as theoretical reasons, the inventive concept and its salient principles may be applied to other shapes. By way of example, a semiconductor device 10′ constructed on the basis of a quadrangular configuration is shown in FIGURE 5 from which the counterparts of resistors 32 and 34 have been omitted for ease of illustration. Device 10′ is identical in all respects except the shape of the elements to the device 10, already described; accordingly corresponding parts have been designated with common reference numerals, primed in the case of FIGURE 5, making any further description of structure or function unnecessary.

While there have been described what at present are believed to be the preferred embodiments of this invention, it will be obvious to those skilled in the art that various changes and modifications may be made therein without departing from the invention, and it is aimed, therefore, to cover in the appended claims all such changes and modifications as fall within the true spirit and scope of the invention.

I claim:

1. A semiconductor device comprising: a body of semiconductive material having a pair of opposed major surfaces; at least two P-N junctions on each of said major surfaces, each junction on one of said surfaces being opposed by a respective junction on the other of said surfaces; individual terminal connections for one of said junctions and for the opposing junction; individual asymmetrical resistive impedance means interconnecting the respective junctions on each of said major surfaces; and a base electrode making non-rectifying contact with said body.

2. A semiconductor device comprising: a body of semiconductive material of one conductivity-type; regions of the opposite conductivity-type on one surface of said body forming therewith at least two spaced P-N junctions; regions of said opposite conductivity-type on an opposite surface of said body forming therewith at least two additional spaced P-N junctions, in operative emitter-collector relation to the first-mentioned P-N junctions; individual resistive impedance means, interconnecting the respective regions on each surface of said body; and means for direct individual electrical connection of one region on each of said surfaces to a source of unidirectional bias potential.

3. A semiconductor device comprising: a body of semiconductive material of one conductivity-type; regions of the opposite conductivity-type on one surface of said body forming therewith at least two spaced P-N junctions; regions of said opposite conductivity-type on an opposite surface of said body forming therewith at least two additional spaced P-N junctions, each substantially opposing a respective one of the first-mentioned P-N junctions; individual resistive impedance means, interconnecting the respective regions on each surface of said body; means for direct individual electrical connection of one of said regions on said one surface to a source of unidirectional bias potential of one polarity and that region on said opposite surface which opposes said one region to a source of unidirectional bias potential of opposite polarity; and a base electrode making non-rectifying contact with said body.

4. A semiconductor device comprising: a body of semiconductive material of one conductivity-type; regions of the opposite conductivity-type on one surface of said body forming therewith at least two spaced P-N junctions, one surrounding the other; regions of said opposite conductivity-type on an opposite surface of said body forming therewith at least two additional spaced P-N junctions, each substantially opposing and being equal in area and identical in configuration to a respective one of the first-mentioned P-N junctions; individual resistive impedance means interconnecting the respective regions on each surface of said body; means for direct individual electrical connection of the innermost region on said one surface to a source of unidirectional bias potential of one polarity and the innermost region on said opposite surface to a source of unidirectional bias potential of opposite polarity; and a base electrode making non-rectifying contact with an area of said body circumscribing said regions.

5. A semiconductor device comprising. a wafer of semiconductive material having at least two concentric, closely-spaced P-N junctions on each major surfaces, the respective junctions on one major surface being substantially identical i narea, configuration and location to those on the opposite major surface; individual terminal connections for the innermost junction on each said major surface; individual resistive impedance means interconnecting the respective junctions on each said major surface; and a base electrode in non-rectifying contact with said wafer.

6. A semiconductor device according to claim 5 wherein each of said individual impedance means has high and low impedance conditions depending on the polarity of applied bias potential and each interconnects said respective junctions so as to present the same impedance condition for a potential of given polarity applied to said terminal connections.

7. A semiconductor device according to claim 5 wherein each of said individual impedance means comprises a rectifying junction having high and low impedance conditions depending on the polarity of an applied bias potential, each said junction being so disposed as to present the same impedance condition for a potential of given polarity applied to said terminal connections.

8. A semiconductor device comprising: a wafer of semiconductive material of one conductivity-type; a region of opposite conductivity-type on each major surface of said wafer forming therewith opposed, generally circular P-N junctions of substantially equal area; a second region of said opposite conductivity-type on each said major surface forming therewith opposed, generally annular P-N junctions of substantially equal area, concentric with and spaced from said first mentioned P-N junctions; individual resistive impedance means, each having a value of ohmic resistance comparable in magnitude to that of one of said circular junctions, electrically interconnecting the respective regions on each of said surfaces; means for individually connecting each of said first-mentioned regions to a source of bias potential; and a base electrode in non-rectifying contact with said wafer.

9. A semiconductor device comprising: a thin circular wafer of semiconductive material of one conductivity-type; a region of opposite conductivity-type on each major surface of said wafer forming therewith opposed, generally circular P-N junctions of substantially equal area; a second region of said opposite conductivity-type on each of said major surface forming therewith opposed, generally annular P-N junctions of substantially equal area, concentric with each and closely surrounding a respective one of said first mentioned P-N junctions; individual asymmetrical resistive impedance means, each having a value of ohmic resistance in one direction comparable in magnitude to that of one of said circular junctions, electrically interconnecting the respective regions on each of said surfaces; individual means for connecting one of said first-mentioned regions directly to a source of unidirectional bias potential of one polarity and the other of said first-mentioned regions directly to a source of unidirectional bias potential of opposite polarity; and an annular base electrode on the peripheral edge of said wafer.

10. A semiconductor device comprising: a wafer of semiconductive material of one conductivity-type; a region of opposite conductivity-type on each major surface of said wafer forming therewith opposed, generally circular P-N junctions of substantially equal area; a second region of said opposite conductivity-type on each said major surface forming therewith opposed, generally annular P-N junctions of substantially equal area, concentric with said first-mentioned P-N junctions; an individual connection terminal in direct electrical contact with each of said first-mentioned regions; individual asymmetrical resistive impedance means, each having a value of ohmic resistance in one direction comparable in magnitude to that of one of said circular junctions, each electrically connecting one of said second regions to the respective connection terminal; and a base electrode on the peripheral edge of said wafer.

11. A semiconductor device comprising: a quadrangular wafer of semiconductive material of one conductivity-type; a region of opposite conductivity-type on each maojr surface of said wafer forming therewith opposed, P-N junctions of solid quadrangular form and substantially equal area; a second region of said opposite conductivity-type on each said major surface forming therewith opposed, P-N junctions of hollow quadrangular form and substantially equal area, each closely surrounding a respective one of said first-mentioned P-N junctions; individual resistive impedance means electrically interconnecting the respective regions on each of said surfaces; means for individually connecting each of said fist-mentioned regions to a source of bias potential; and a base electrode making non-rectifying contact with said wafer.

References Cited in the file of this patent

UNITED STATES PATENTS

| | | |
|---|---|---|
| 2,655,610 | Ebers | Oct. 13, 1953 |
| 2,754,431 | Johnson | July 10, 1956 |

FOREIGN PATENTS

| | | |
|---|---|---|
| 761,926 | Great Britain | Nov. 21, 1956 |